United States Patent
Kimura et al.

(10) Patent No.: US 10,121,732 B2
(45) Date of Patent: Nov. 6, 2018

(54) SEMICONDUCTOR DEVICE AND ELECTRIC POWER CONVERSION DEVICE HAVING RELAY TERMINAL DIRECTLY FIXED TO AN INSULATING FILM OF BASE PLATE

(71) Applicant: Mitsubishi Electric Corporation, Tokyo (JP)

(72) Inventors: Yoshitaka Kimura, Tokyo (JP); Yoshitaka Otsubo, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/784,472

(22) Filed: Oct. 16, 2017

(65) Prior Publication Data

US 2018/0226324 A1  Aug. 9, 2018

(30) Foreign Application Priority Data

Feb. 3, 2017  (JP) .................... 2017-018753

(51) Int. Cl.
| | | |
|---|---|---|
| H01L 23/14 | (2006.01) | |
| H01L 23/49 | (2006.01) | |
| H01L 23/00 | (2006.01) | |
| H01L 25/18 | (2006.01) | |
| H01L 29/739 | (2006.01) | |
| H01L 29/861 | (2006.01) | |

(52) U.S. Cl.
CPC .......... *H01L 23/49* (2013.01); *H01L 23/142* (2013.01); *H01L 24/48* (2013.01); *H01L 25/18* (2013.01); H01L 29/7395 (2013.01); H01L 29/861 (2013.01); H01L 2224/4816 (2013.01); H01L 2224/48091 (2013.01); H01L 2224/48137 (2013.01)

(58) Field of Classification Search
CPC ..... H01L 23/142; H01L 23/49; H01L 23/492; H01L 24/48; H01L 25/18
See application file for complete search history.

(56) References Cited

U.S. PATENT DOCUMENTS 6,521,983 B1 * 2/2003 Yoshimatsu .......... H01L 25/072
257/678

FOREIGN PATENT DOCUMENTS

JP  2015-142018 A  8/2015

* cited by examiner

*Primary Examiner* — Hoai V Pham
(74) *Attorney, Agent, or Firm* — Studebaker & Brackett PC

(57) ABSTRACT

A semiconductor device includes: a base plate including a metallic base plate and an insulating film provided on the metallic base plate; a semiconductor chip provided on the base plate; a control board disposed above the semiconductor chip; and a relay terminal connected to a signal electrode of the semiconductor chip through a signal line wire, extending to the control board, and connected to the control board, wherein the relay terminal is directly fixed to the insulating film of the base plate.

6 Claims, 5 Drawing Sheets

SEMICONDUCTOR DEVICE AND ELECTRIC POWER CONVERSION DEVICE HAVING RELAY TERMINAL DIRECTLY FIXED TO AN INSULATING FILM OF BASE PLATE

BACKGROUND OF THE INVENTION

Field

The present invention relates to a semiconductor device and an electric power conversion device.

Background

A semiconductor device for power control includes a switching device, such as an IGBT, a MOSFET, or an FWDi, which is mounted in a housing, and the semiconductor device is called a power module. Examples of the power module include an intelligent power module (IPM) having a driving/protection circuit built therein. The IPM has a configuration in which a control board and a power line unit are housed in one package.

The power module is formed in a housing of an inverter or a power conditioner. Accordingly, the size of the power module affects the size of the housing. There is a demand for miniaturization of these products, and thus a low-profile power module is required. For example, a semiconductor device having a configuration in which a relay terminal is directly fixed onto a circuit pattern of a base plate so as to reduce the height of the device is proposed (e.g., see JP 2015-142018 A).

However, it is necessary to provide a dedicated pattern for each type of relay terminals so as to process the relay terminals. Accordingly, an extra space is required, which inhibits miniaturization of the semiconductor device. Further, since a circuit pattern and a relay terminal are soldered together, there is a concern about the embrittlement of the solder due to a thermal stress.

SUMMARY

The present invention has been made to solve the above-mentioned problem, and an object of the present invention is to provide a semiconductor device and an electric power conversion device in which a high degree of freedom of design and a reduction in the height of the device can be achieved.

According to the present invention, a semiconductor device includes: a base plate including a metallic base plate and an insulating film provided on the metallic base plate; a semiconductor chip provided on the base plate; a control board disposed above the semiconductor chip; and a relay terminal connected to a signal electrode of the semiconductor chip through a signal line wire, extending to the control board, and connected to the control board, wherein the relay terminal is directly fixed to the insulating film of the base plate.

In the present invention, the relay terminal is directly fixed to the insulating film of the base plate, instead of being fixed to the circuit pattern. Accordingly, there is no need for providing a dedicated pattern for each type of the relay terminals, and the relay terminals can be arranged at any locations on the upper surface of the base plate. Therefore, a layout of devices in a product can be arbitrarily determined, which leads to an improvement in the degree of freedom of design. Further, since the height of each signal line wire can be reduced, a reduction in the height of the device can be achieved.

Other and further objects, features and advantages of the invention will appear more fully from the following description.

DESCRIPTION OF EMBODIMENTS

A semiconductor device and an electric power conversion device according to the embodiments of the present invention will be described with reference to the drawings. The same components will be denoted by the same symbols, and the repeated description thereof may be omitted.

First Embodiment

Figure 1:
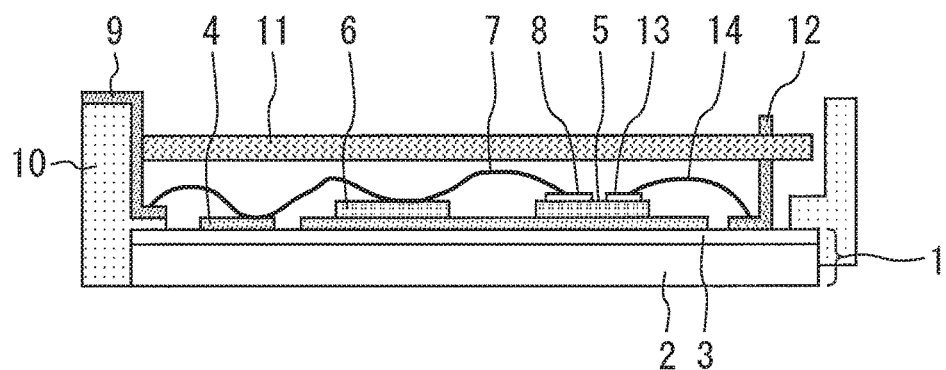
FIG. 1 is a sectional view illustrating a semiconductor device according to a first embodiment of the present invention.

FIG. 1 is a sectional view illustrating a semiconductor device according to a first embodiment of the present invention. A base plate 1 is a resin insulating metal substrate including a metallic base plate 2 and a resin insulating film 3 which is formed on the metallic base plate 2. A circuit pattern 4 is formed on an upper surface of the base plate 1.

Semiconductor chips 5 and 6 are formed on the base plate 1. The semiconductor chip 5 is a switching IGBT, and the semiconductor chip 6 is a diode that allows a current to return. Each main line wire 7 sequentially connects a main electrode 8 of the semiconductor chip 5 to an upper electrode of the semiconductor chip 6, the circuit pattern 4, and a main electrode terminal 9 in this order. The main electrode terminal 9 is provided in a step part of a case 10.

A control board 11 is disposed above the semiconductor chips 5 and 6. Each relay terminal 12 is connected to a corresponding signal electrode 13 of the semiconductor chip 5 through each signal line wire 14, extends to the control board 11, and is connected to the control board 11. The relay terminal 12 is directly fixed to the resin insulating film 3 of the base plate 1. The relay terminal 12 is also fixed with an adhesive during adhesion of the case 10. The adhesive preferably has insulation properties, and it is preferable to use a material in which a deterioration, such as cracking, is less likely to occur due to a thermal stress.

In this embodiment, the relay terminal 12 is directly fixed to the resin insulating film 3 of the base plate 1, instead of being fixed to the circuit pattern 4. Accordingly, there is no need for providing a dedicated pattern for each type of the relay terminals 12, and the relay terminals 12 can be arranged at any locations on the upper surface of the base plate 1. Therefore, a layout of devices in a product can be arbitrarily determined, which leads to an improvement in the degree of freedom of design. Further, since the height of each signal line wire 14 can be reduced, a reduction in the height of the device can be achieved.

Note that there is a possibility that if the distance between an end face of the semiconductor chip 5 and each signal line wire 14 is short, short-circuiting may occur when a high voltage is applied. For this reason, the height of the wire is increased so as to ensure the distance between the end face of the semiconductor chip 5 and each signal line wire 14. Therefore, it is necessary to provide the relay terminals 12 on the resin insulating film 3 of the base plate 1 as described above to reduce the height of each signal line wire 14. On the other hand, since the main line wire 7 connected to the main electrode terminal 9 is connected to the circuit pattern 4, the wire height can be set to a low height. Therefore, the main electrode terminal 9 can be provided in the step part of the case 10.

The present invention can also be applied to a power module having a structure including a base plate and an insulating substrate. However, a difference between the linear expansion coefficient of a metal of the base plate and the linear expansion coefficient of ceramic, which is a base component of the insulating substrate, is large. When a heat treatment is carried out in a manufacturing process, a stress is generated depending on the linear expansion coefficient difference, which leads to an increase in warpage of the base plate. On the other hand, in the resin insulating metal substrate, the resin insulating film 3 is thin and the linear expansion coefficient difference is not larger than that of ceramic, and thus a warpage of the base plate 1 is small. As a result, the position accuracy of each relay terminal 12 can be improved.

Second Embodiment

Figure 2:
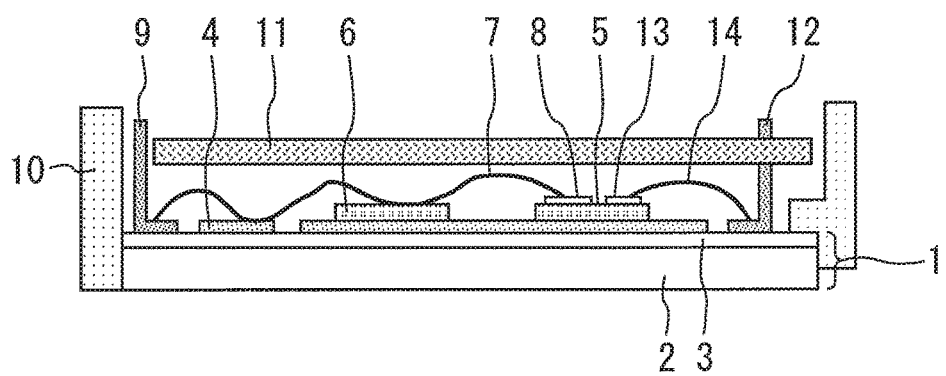
FIG. 2 is a sectional view illustrating a semiconductor device according to a second embodiment of the present invention.

FIG. 2 is a sectional view illustrating a semiconductor device according to a second embodiment of the present invention. The main electrode terminal 9 is also directly fixed to the resin insulating film 3 of the base plate 1. Thus, when all the terminals are directly fixed to the resin insulating film 3 of the base plate 1, a further reduction in the height of the device can be achieved.

Third Embodiment

Figure 3:
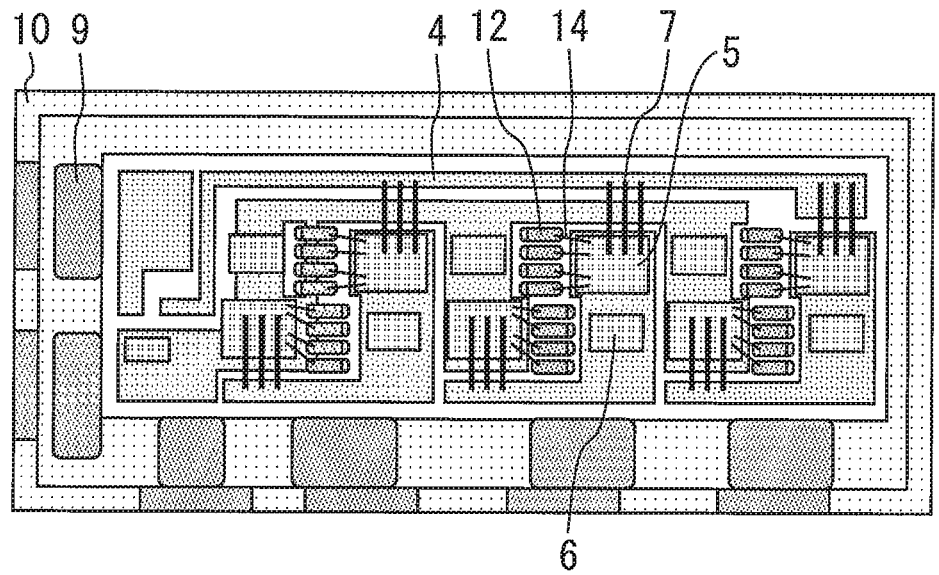
FIG. 3 is a plan view illustrating a semiconductor device according to a third embodiment of the present invention.
Figure 4:
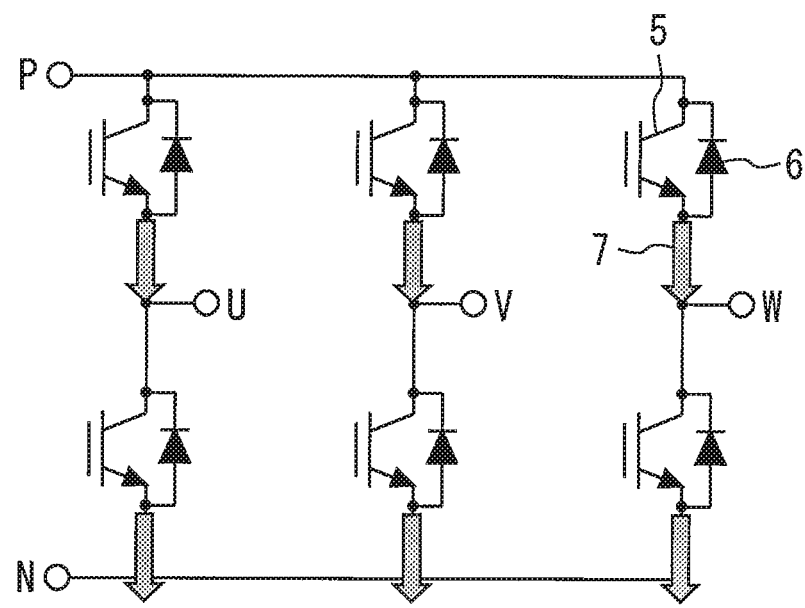
FIG. 4 is a circuit diagram illustrating the semiconductor device according to the third embodiment of the present invention.

FIG. 3 is a plan view illustrating a semiconductor device according to a third embodiment of the present invention. The relay terminals 12 are disposed on an inner side of the base plate 1 than the circuit pattern 4 on the upper surface of the base plate 1. FIG. 4 is a circuit diagram illustrating the semiconductor device according to the third embodiment of the present invention. Each arrow illustrated in FIG. 4 corresponds to the main line wire 7.

Figure 5:
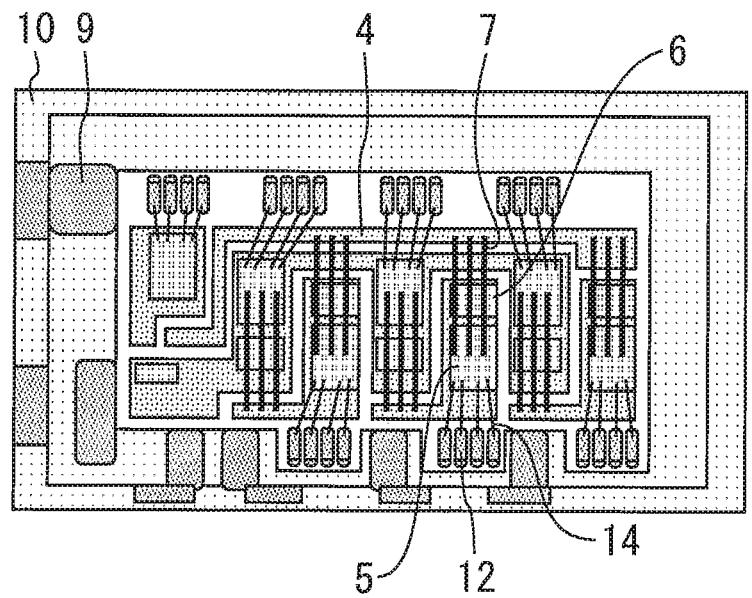
FIG. 5 is a plan view illustrating a semiconductor device according to the comparative example.

Next, advantageous effects of this embodiment will be described in comparison with a comparative example. FIG. 5 is a plan view illustrating a semiconductor device according to the comparative example. In the comparative example, the relay terminals 12 are disposed at an outer periphery of the upper surface of the base plate 1. In this case, also the semiconductor chip 5 needs to be disposed in the vicinity of the outer periphery so as to connect the signal electrodes 13 of the semiconductor chip 5 and the relay terminals 12 with wires. Thus, each main line wire 7 connected to the main electrode 8 of the semiconductor chip 5 has a long length. This results in problems such as an increase in the inductance of each main line wire 7, a reduction in lifetime of the semiconductor device due to an increase in the amount of generated heat at the time of energization, and an increase in surge voltage during switching.

On the other hand, in this embodiment, the relay terminals 12 on the upper surface of the base plate 1 are disposed on the inner side of the base plate 1 than the circuit pattern 4. Accordingly, the degree of freedom of arrangement is increased and the semiconductor chip 5 can be disposed in proximity to the circuit pattern 4, which makes it possible to shorten the main line wire 7 to reduce the inductance. Further, since each signal line wire 14 can be shortened, the effect of a drop of a signal voltage due to the signal line wire 14 is reduced. Furthermore, a reduction in the number of extra circuit patterns enables the miniaturization of the device.

Fourth Embodiment

Figure 6:
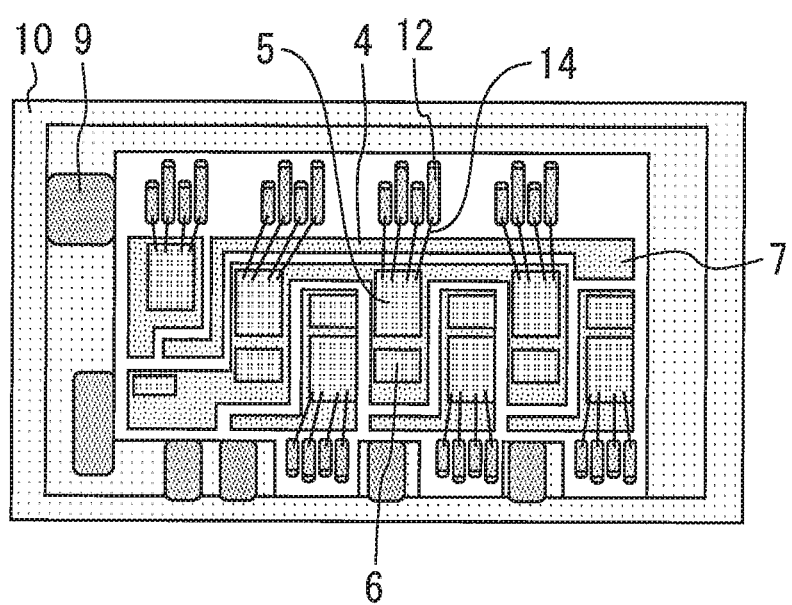
FIG. 6 is a plan view illustrating a semiconductor device according to a fourth embodiment of the present invention.
Figure 7:
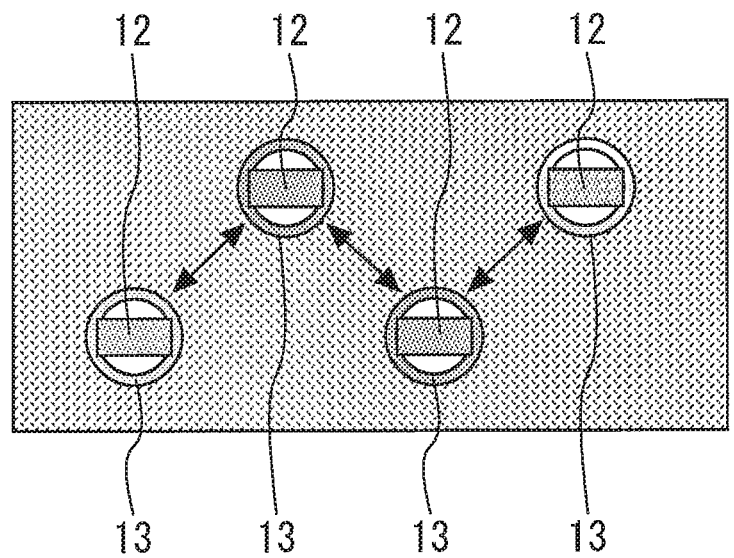
FIG. 7 is an enlarged plan view illustrating a connecting part between a control board and a plurality of relay terminals according to the fourth embodiment of the present invention.

FIG. 6 is a plan view illustrating a semiconductor device according to a fourth embodiment of the present invention. FIG. 7 is an enlarged plan view illustrating a connecting part between a control board and a plurality of relay terminals according to the fourth embodiment of the present invention. The plurality of relay terminals 12 are disposed in a zig-zag manner on the upper surface of the base plate 1. A leading end of each of the plurality of relay terminals 12 penetrates through a corresponding one of a plurality of through-holes 13 of the control board 11 and is connected to the control board 11.

Figure 8:
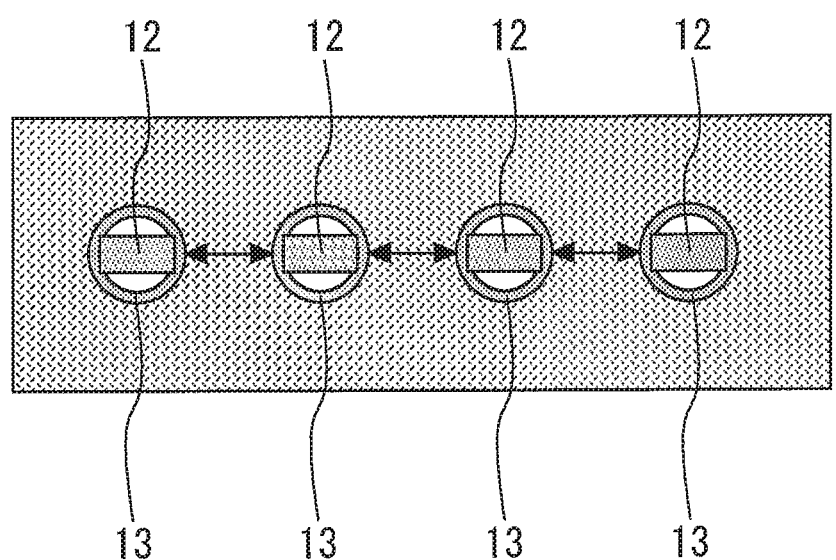
FIG. 8 is an enlarged plan view illustrating a connecting part between a control board and a plurality of relay terminals according to the comparative example.

Next, advantageous effects of this embodiment will be described in comparison with a comparative example. FIG. 8 is an enlarged plan view illustrating a connecting part between a control board and a plurality of relay terminals according to the comparative example. In the comparative example, the plurality of relay terminals 12 are linearly disposed. To ensure an insulation distance between the adjacent relay terminals 12, a pitch between terminals is increased.

On the other hand, in this embodiment, the pitch between terminals can be reduced while the insulation distance between the adjacent relay terminals 12 is ensured. Consequently, the density of components within the device can be increased and the electric components can be disposed in proximity to each other, thereby enabling the miniaturization of the semiconductor device and expansion of an electric component mounting area.

The semiconductor chips 5 and 6 are not limited to semiconductor chips formed of silicon, but instead may be formed of a wide-bandgap semiconductor having a bandgap wider than that of silicon. The wide-bandgap semiconductor is, for example, a silicon carbide, a gallium-nitride-based material, or diamond. A semiconductor chip formed of such a wide-bandgap semiconductor has a high voltage resistance and a high allowable current density, and thus can be miniaturized. The use of such a miniaturized semiconductor chip enables the miniaturization and high integration of the semiconductor device in which the semiconductor chip is incorporated. Further, since the semiconductor chip has a high heat resistance, a radiation fin of a heatsink can be miniaturized and a water-cooled part can be air-cooled, which leads to further miniaturization of the semiconductor device. Further, since the semiconductor chip has a low power loss and a high efficiency, a highly efficient semiconductor device can be achieved. Both the semiconductor chips 5 and 6 are desirably formed of a wide-bandgap semiconductor. However, only one of the semiconductor chips 5 and 6 may be formed of a wide-bandgap semiconductor. Also in this case, the advantageous effects described in this embodiment can be obtained.

Fifth Embodiment

In this embodiment, the semiconductor devices according to the first to fourth embodiments described above are applied to an electric power conversion device. The electric power conversion device is, for example, an inverter device, a converter device, a servo amplifier, or a power supply unit. Although the present invention is not limited to a specific electric power conversion device, a case where the present invention is applied to a three-phase inverter will be described below.

Figure 9:
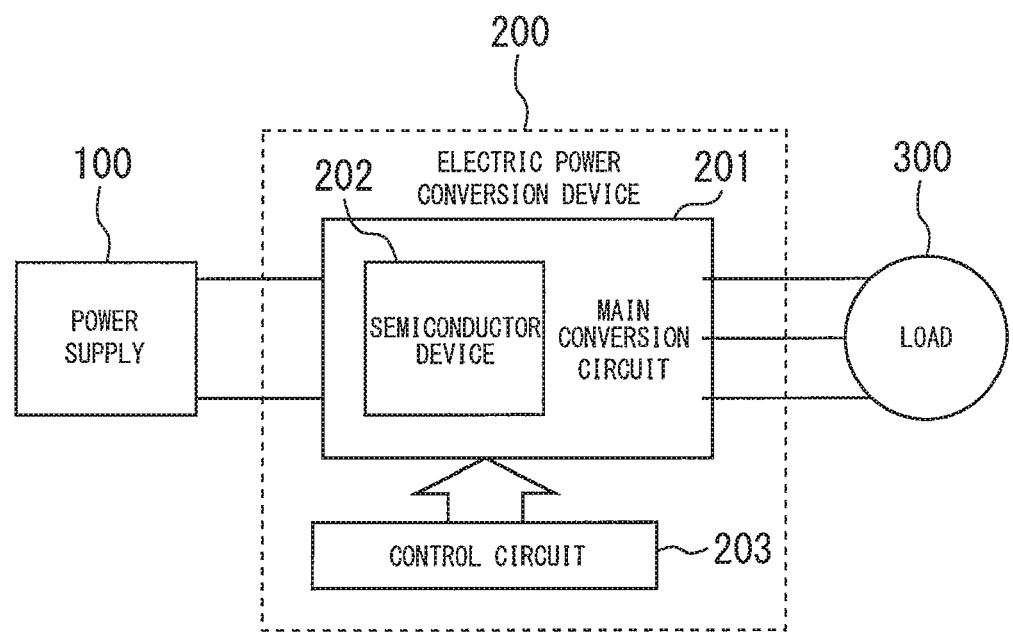
FIG. 9 is a block diagram illustrating a configuration of an electric power conversion system to which the electric power conversion device according to the fifth embodiment of the present invention is applied.

FIG. 9 is a block diagram illustrating a configuration of an electric power conversion system to which the electric power conversion device according to the fifth embodiment of the present invention is applied. This electric power conversion system includes a power supply 100, an electric power conversion device 200, and a load 300. The power supply 100 is a DC power supply and supplies DC power to the electric power conversion device 200. The power supply 100 can be composed of various components. For example, the power supply 100 can be composed of a DC system, a solar cell, or a storage battery, or may be composed of a rectifier or an AC/DC converter, which is connected to an AC system. Alternatively, the power supply 100 may be composed of a DC/DC converter that converts DC power output from a DC system to predetermined power.

The electric power conversion device 200 is a three-phase inverter connected to a node between the power supply 100 and the load 300, converts DC power supplied from the power supply 100 into AC power, and supplies the AC power to the load 300. The electric power conversion device 200 includes a main conversion circuit 201 that converts DC power into AC power and outputs the AC power, and a control circuit 203 that outputs a control signal for controlling the main conversion circuit 201 to the main conversion circuit 201.

The load 300 is a three-phase electric motor that is driven by AC power supplied from the electric power conversion device 200. The load 300 is not limited to a specific application. The load is used as an electric motor mounted on various electric devices, such as an electric motor for, for example, a hybrid vehicle, an electric vehicle, a railroad vehicle, an elevator, or an air-conditioner.

The electric power conversion device 200 will be described in detail below. The main conversion circuit 201 includes a switching device and a reflux diode (not illustrated). When the switching device is switched, the main conversion circuit 201 converts DC power supplied from the power supply 100 into AC power, and supplies the AC power to the load 300. The main conversion circuit 201 may have various types of specific circuit configurations. The main conversion circuit 201 according to this embodiment is a two-level three-phase full-bridge circuit, which can be composed of six switching devices and six reflux diodes connected in antiparallel with the respective switching devices. Each switching device and each reflux diode of the main conversion circuit 201 are composed of a semiconductor device 202 corresponding to any one of the first to fourth embodiments described above. Every two switching devices of the six switching devices are connected in series and constitute a vertical arm. Each vertical arm constitutes each phase (U-phase, V-phase, W-phase) of the full-bridge circuit. Output terminals of each vertical arm, i.e., three output terminals of the main conversion circuit 201, are connected to the load 300.

Further, the main conversion circuit 201 includes a drive circuit (not illustrated) that drives each switching device. The drive circuit may be incorporated in the semiconductor device 202. Another drive circuit different from the semiconductor device 202 may be provided. The drive circuit generates a drive signal for driving each switching device of the main conversion circuit 201, and supplies the generated drive signal to a control electrode of each switching device of the main conversion circuit 201. Specifically, the drive circuit outputs, to the control electrode of each switching device, a drive signal for turning on each switching device and a drive signal for turning off each switching device, according to the control signal output from the control circuit 203, which is described later. When the ON-state of each switching device is maintained, the drive signal is a voltage signal (ON signal) having a voltage equal to or higher than a threshold voltage of the switching device. When the OFF-state of each switching device is maintained, the drive signal is a voltage signal (OFF signal) having a voltage equal to or lower than the threshold voltage of the switching device.

The control circuit 203 controls each switching device of the main conversion circuit 201 so as to supply a desired power to the load 300. Specifically, the control circuit 203 calculates a period (ON period), in which each switching device of the main conversion circuit 201 is in the ON state, based on the power to be supplied to the load 300. For example, the main conversion circuit 201 can be controlled by a PWM control for modulating the ON period of each switching device depending on the voltage to be output. Further, the control circuit 203 outputs a control command (control signal) to the drive circuit included in the main conversion circuit 201 so that the ON signal is output to each switching device to be turned on and an OFF signal is output to each switching device to be turned off at each point. The drive circuit outputs the ON signal or OFF signal, as the drive signal, to the control electrode of each switching device according to the control signal.

In the electric power conversion device according to this embodiment, the semiconductor devices according to the first to fourth embodiments are applied as the semiconductor device 202. Accordingly, the height of the semiconductor device 202 itself is reduced and the pitch between the terminals of the semiconductor device 202 can be reduced, which leads to miniaturization of the electric power conversion device.

While this embodiment illustrates an example in which the present invention is applied to a two-level three-phase inverter, the present invention is not limited to this and can be applied to various electric power conversion devices. While this embodiment illustrates a two-level electric power conversion device, the present invention can also be applied to a three-level or multi-level electric power conversion device. When power is supplied to a single-phase load, the present invention may be applied to a single-phase inverter. The present invention can also be applied to a DC/DC converter or an AC/DC converter when power is supplied to a DC load or the like.

Further, in the electric power conversion device to which the present invention is applied, the above-mentioned load is not limited to an electric motor. For example, the load may also be used as a power supply device for an electric discharge machine, a laser beam machine, an induction heating cooker, or a non-contact device power feeding system. More alternatively, the load may be used as a power conditioner for a photovoltaic power generating system, an electricity storage system, or the like.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2017-018753, filed on Feb. 3, 2017 including specification, claims, drawings and summary, on which the Convention priority of the present application is based, is incorporated herein by reference in its entirety.

The invention claimed is:

1. A semiconductor device comprising:
   a base plate including a metallic base plate and an insulating film provided on the metallic base plate;
   a semiconductor chip provided on the base plate;
   a control board disposed above the semiconductor chip; and
   a relay terminal connected to a signal electrode of the semiconductor chip through a signal line wire, extending to the control board, and connected to the control board,
   wherein the relay terminal is directly fixed to the insulating film of the base plate.

2. The semiconductor device according to claim 1, further comprising a main electrode terminal connected to a main electrode of the semiconductor chip through a main line wire and directly fixed to the insulating film of the base plate.

3. The semiconductor device according to claim 1, comprising:
   a circuit pattern provided on an upper surface of the base plate; and
   a main line wire connecting a main electrode of the semiconductor chip to the circuit pattern,
   wherein the relay terminal is disposed on an inner side of the base plate than the circuit pattern on an upper surface of the base plate.

4. The semiconductor device according to claim 1, wherein the relay terminal includes a plurality of terminals disposed in a zig-zag manner on an upper surface of the base plate.

5. The semiconductor device according to any claim 1, wherein the semiconductor chip is made of a wide-band-gap semiconductor.

6. An electric power conversion device comprising:
   a main conversion circuit including the semiconductor device according to claim 1, converting input power and outputting the converted power, and
   a control circuit outputting a control signal for controlling the main conversion circuit to the main conversion circuit.

* * * * *